United States Patent [19]

Larker

[11] 4,401,728
[45] Aug. 30, 1983

[54] COMPOSITE MATERIAL

[75] Inventor: Hans Larker, Robertsfors, Sweden

[73] Assignee: ASEA Aktiebolag, Västerås, Sweden

[21] Appl. No.: 243,518

[22] Filed: Mar. 13, 1981

[30] Foreign Application Priority Data

Mar. 27, 1980 [SE] Sweden ................................ 8002365

[51] Int. Cl.³ ............................................ B32B 15/02
[52] U.S. Cl. ............................. 428/614; 174/16 HS; 357/81; 428/675; 428/620
[58] Field of Search ................. 357/81; 428/597, 601, 428/614, 620, 675, 610, 611; 174/16 HS; 361/388

[56] References Cited

U.S. PATENT DOCUMENTS

| 3,128,419 | 4/1964 | Waldkötter et al. | 428/614 |
| 3,399,332 | 8/1968 | Savolainen | 428/614 |
| 4,283,464 | 8/1981 | Hascoe | 428/614 |

FOREIGN PATENT DOCUMENTS

| 676283 | 12/1963 | Canada | 357/81 C |
| 2826252 | 1/1979 | Fed. Rep. of Germany | 428/614 |
| 53-33059 | 3/1979 | Japan | 357/81 C |
| 2017408 | 10/1979 | United Kingdom | 428/620 |

OTHER PUBLICATIONS

Lyman, T., ed.; *Metals Handbook*, 1948 Edition, Am. Soc. for Metals, p. 603, (1948).
Bozorth, R. M., *Ferromagnetism*, Van Notrand Co., p. 106, (1951).
Doo, V. Y. et al., "High Performance Single Chip Module", IBM Tech. Disclosure Bulletin, vol. 20, No. 4, pp. 1438-1439, Sep. 1977.

Primary Examiner—Michael L. Lewis
Attorney, Agent, or Firm—Watson, Cole, Grindle & Watson

[57] ABSTRACT

Composite material comprising a matrix of an alloy of about 64 percent by weight iron and about 36 percent by weight nickel or of a different alloy containing iron and nickel having a coefficient of thermal expansion of at the most $3.10^{-6}K^{-1}$ within the temperature range 20° C. to 100° C. and veins of copper, distributed in one direction through the matrix, with the copper and the alloy metallurgically bonded to each other through a boundary layer containing copper and the alloy having a thickness of at the most 5 μm.

4 Claims, 5 Drawing Figures

COMPOSITE MATERIAL

TECHNICAL FIELD

This invention relates to an improved composite material consisting of a nickel/iron alloy containing spaced-apart veins of copper which can, inter alia, be used as a substitute for molybdenum in the construction of intermediate plates for semiconductor devices.

BACKGROUND ART

Semiconductor devices designed to operate with high currents usually comprise a wafer of a semiconducting material, often silicon, which is contacted on at least one side with an intermediate plate of a material (e.g. molybdenum) having approximately the same coefficient of thermal expansion as the semiconducting material.

A semiconductor device is further provided with electrical connecting bodies, usually of copper, for the supply and discharge of electric current to and from the semiconductor wafer. The connecting bodies are often arranged in direct pressure contact with the semiconductor wafer. They are normally connected to cooling bodies, usually of copper or aluminium, so that the semiconductor wafer is cooled from one or both directions. The connecting bodies themselves may also be designed so as to serve as cooling bodies.

The role of an intermediate plate is to protect the semiconductor wafer from stresses caused by mutual movements between the semiconductor wafer and the connecting bodies upon temperature variations caused by differences in the coefficients of thermal expansion. To obtain an efficient discharge of heat from the semiconductor wafer, the intermediate plate needs to have high thermal conductivity.

Molybdenum and tungsten are examples of materials which have the required thermal conductivity and coefficient of thermal expansion for an intermediate plate but both are extremely expensive components in semiconductor devices.

One object of the present invention is to provide a cheaper material than molybdenum, which preferably has approximately the same coefficient of thermal expansion as molybdenum, or at least a substantially lower coefficient of thermal expansion than copper, and which, in addition, has a sufficiently high thermal conductivity to replace molybdenum as the material for an intermediate plate.

DISCLOSURE OF INVENTION

According to one aspect of the invention, a composite material comprises a matrix of an alloy of iron and nickel having a coefficient of thermal expansion of at the most $3 \cdot 10^{-6} K^{-1}$ within the temperature range 20° C. to 100° C. and a plurality of spaced-apart veins of copper, all extending in substantially the same direction in the matrix, with the copper in each vein and the alloy of the matrix bonded to each other metallurgically through a boundary layer containing copper and the alloy and having a thickness of at the most 5 μm.

Preferably, each boundary layer has a thickness of 0.01 μm–1 μm.

In a composite material according to the invention, the components are so efficiently bonded to each other that the bond is not broken during the heat cycle which normally occurs in a semiconductor device (from about −50° C. to about +100° C.). The copper portion preferably constitutes 15–40 percent by volume in the composite material. A composite material according to the invention can have a coefficient of thermal expansion, perpendicular to the copper veins, of $4 \cdot 10^{-6} K^{-1}$ to $10 \cdot 10^{-6} K^{-1}$ and a thermal conductivity of 75 to 150 $W \cdot m^{-1} \cdot K^{-1}$, in the direction of the copper veins. When employing the composite material in an intermediate plate for a semiconductor device, the copper veins are preferably directed substantially perpendicular to the plane of the plate in order to obtain the best possible thermal dissipation from the semiconductor wafer to the adjacent connecting body.

The metallurgical bond between the alloy and the copper occurring in the thin boundary layer may be obtained by joining together elements of the components of the composite material at such a low temperature that the components are in a solid state. If the copper is applied to the iron/nickel alloy in molten form, for example if molten copper is cast into bored holes in a mass of iron/nickel alloy, an unsatisfactory bond is obtained, resulting in the copper loosening during heat cycling of the composite material. The reason is that a relatively thick and brittle boundary layer of the components of the composite material is formed if the copper is added at a temperature above its melting point.

Desirably the alloy has 64 percent by weight of iron and 36 percent by weight of nickel (i.e. the material known under the Trade Name "Invar"), which has a coefficient of thermal expansion of about $2 \cdot 10^{-6} K^{-1}$ within the temperature range 20° C. to 100° C. and a melting temperature which is considerably higher than the melting temperature of copper. Although this alloy is the preferred one, it is possible to use other alloys containing iron and nickel, provided the coefficient of thermal expansion does not exceed $3 \cdot 10^{-6} \cdot K^{-1}$ within the noted temperature range. Examples of such alloys are alloys in which up to a few percent of the iron has been replaced by nickel or cobalt or up to a few percent of the nickel has been replaced by iron or cobalt.

According to a further aspect of the invention there is provided a method of manufacturing a composite material comprising an iron/nickel alloy having a coefficient of thermal expansion of at the most $3 \cdot 10^6 K^{-1}$ within the temperature range 20° C. to 100° C. and veins of copper distributed throughout the alloy in which an assembly of the alloy and parallel rods of copper are subjected to isostatic compression or hydrostatic extrusion at a temperature which is lower than the melting temperature of the copper.

According to one embodiment of the method, isostatic pressing is used during the manufacture at a temperature of 600° C. to 900° C., preferably at a temperature of 650° C. to 750° C. and at a pressure of 10 to 500 MPa. According to another embodiment, there is used during the manufacture, hydrostatic extrusion with preheated elements, for example preheated to about 300° to 500° C., at a pressure of 500 to 1500 MPa.

The elements of the iron/nickel alloy may have the form of sheets, which may or may not be machined and could be plane or corrugated sheets provided with slots or have the form of tubes. The elements of copper may have the form of wires, rods or sheets, which may, for example, be arranged between sheets of the iron/nickel alloy, possibly in folds or in slots in such sheets, or inside tubes of the iron/nickel alloy.

After the noted isostatic pressing, the composite material thus obtained is preferably subjected to a hydrostatic extrusion, suitably at room temperature, with a reduction of the cross-section of at least 30%. A hydrostatic extrusion performed after the isostatic pressing results in the copper and the alloy requiring a higher yield point, which enables the use of the composite material over a greater temperature range without plastic fatigue of the metallic materials occurring, as well as in the iron/nickel alloy acquiring a negative expansion coefficient, which reduces the effective expansion coefficient of the composite material.

BRIEF DESCRIPTION OF DRAWING

The invention will now be explained in greater detail, by way of example, with reference to the accompanying drawing, in which.

DESCRIPTION OF PREFERRED EMBODIMENTS

Figure 1:
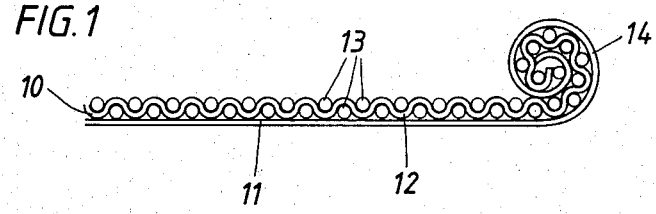
FIGS. 1 to 3 illustrate the manufacture of a composite material according to the present invention using different shaped elements of copper and iron/nickel alloy.

The elements shown in FIG. 1, are a corrugated sheet 10 and a smooth sheet 11 of an alloy containing 64% Fe and 36% Ni and wires 13 of copper. The sheets 10 and 11, which are both shown in a section in the longitudinal direction, have a thickness of 0.6 mm. In transverse folds 12 on both sides of the corrugated sheet 10, there are inserted the copper wires 13, each having a diameter of 1 mm. The sheets 10, 11 with the wires 13 between them are then rolled into a roll 14. FIG. 1 shows the rolling process at an initial stage. The volume of copper in the roll 14 constitutes 33% of the total volume of copper and iron/nickel alloy.

The roll 14 is then placed in a capsule of a low-carbon containing steel (not shown), which is first evacuated, and then sealed. The encapsulated roll is then pressed isostatically with argon as pressure medium at a temperature of 700° C. and a pressure of 200 MPa for a period of one hour. The pressed roll is then subjected to a hydrostatic extrusion at room temperature with castor oil as pressure medium at a pressure of 600 MPa so as to obtain a reduction of the cross-sectional area of the roll by 50%.

Figure 2:
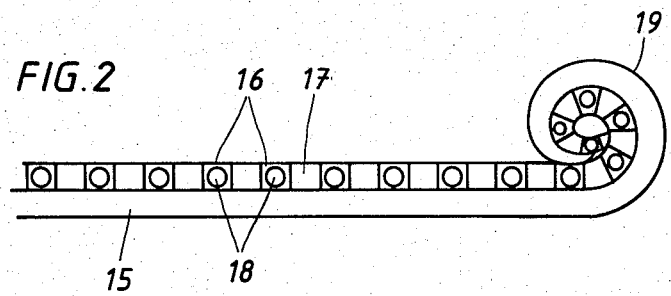

The elements shown in FIG. 2 are a smooth sheet 15 of the above-mentioned iron/nickel alloy and a sheet 17 provided with transverse slots 16 and copper wires 18. The sheets 15 and 17, which are shown in section in the longitudinal direction, have a thickness of 0.6 mm. The slots 16, which have a width of 0.6 mm and are arranged at a distance of 0.6 mm between adjacent edges of adjacent slots, do not reach all the way to the side edges of the sheet 17 so that the sheet is held together by the edge regions. The copper wires 18 have a diameter of 0.6 mm and are arranged in the slots 16. The sheets 15, 17 with copper wires 18 are rolled together into a roll 19. An initial stage of the rolling process is shown in FIG. 2. The volume of copper in the roll 19 constitutes 20% of the total volume of copper and iron/nickel alloy. The roll 19 is first pressed isostatically, while being enclosed in a capsule, and is thereafter extruded hydrostatically in the manner described for the roll 14.

Figure 3:
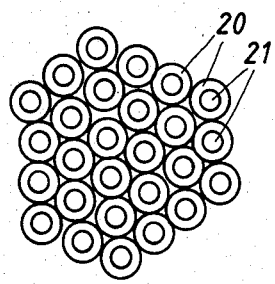

The elements shown in FIG. 3 are a plurality of tubes 20 of the above-mentioned iron/nickel alloy placed adjacent each other, each containing a copper wire 21. The tubes 20, which are shown in radial sections, have an inside diameter of somewhat more than 0.6 mm and an outside diameter of 1.2 mm. The copper wires 21 have a diameter of 0.6 mm. The volume of copper in the array shown in FIG. 3 constitutes 25% of the total volume of copper and iron/nickel alloy.

The array consisting of the copper-filled tubes 20 arranged adjacent each other, is first pressed isostatically while being enclosed in a capsule, and is thereafter extruded hydrostatically, as has been described for the roll 14.

Instead of manufacturing the composite material by isostatic pressing with subsequent hydrostatic extrusion, manufacture of the composite material may take place by hydrostatic extrusion alone, the rolls 14 and 19, or the packet of the tubes 20, then being heated to, for example, 450° C. prior to extrusion and extruded with a reduction of cross-sectional area of, for example, 90%.

Figure 4:
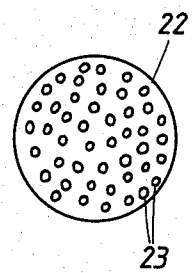
FIG. 4 illustrates a plate, intended for a semiconductor device, of the composite material seen from above.

A typical cross-section of a rod-shaped cylindrical product manufactured in the manner described above from the elements in accordance with FIGS. 1 to 3 is shown in FIG. 4. It consists of a matrix 22 of the iron/nickel alloy containing axially extending veins 23 of copper. If the rod-shaped product is cut up into sheets perpendicular to the axial direction of the veins, plates are obtained (with the exception of the regions outside the slots in the case according to FIG. 2) of the kind shown in FIG. 4, which are suitable for use as intermediate plates in semiconductor devices, as will be described with reference to FIG. 5.

Figure 5:
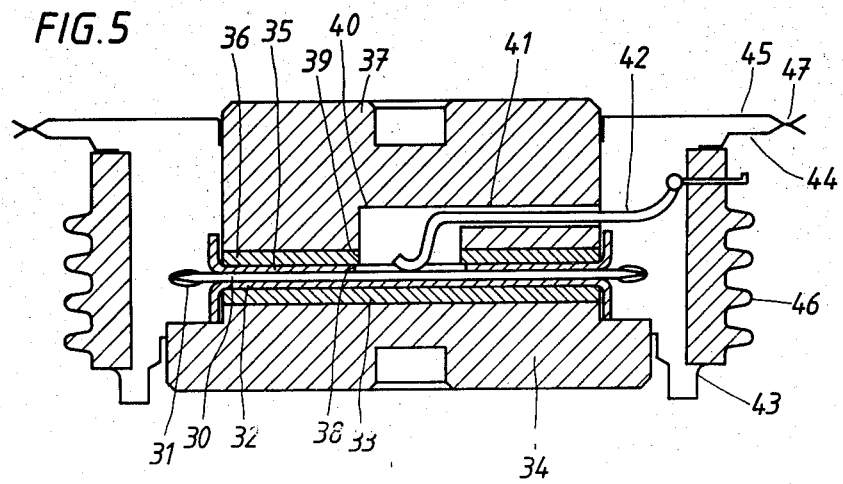
FIG. 5 shows a semiconductor device comprising plates of the composite material.

The semiconductor device according to FIG. 5 has a round silicon wafer 30 of p-n-p type. At its peripheral portion, the silicon wafer has a coating 31 of silicon rubber. A flat bowl 32 of silver makes contact with the lower side of the silicon wafer 30, a loose intermediate plate 33 of the composite material according to the present invention being placed in the bowl 32. A connecting body 34 of copper makes electrical and thermal contact with the intermediate plate 33. Analogously, a flat bowl 35 of silver makes contact with the upper side of the silicon wafer 30, a loose intermediate plate 36 of the composite material according to the present invention being placed in the bowl 35. A connecting body 37 of copper makes electrical and thermal contact with the intermediate plate 36. In the intermediate plates 33 and 36, the copper veins run in a direction from the silicon wafer 30 to the respective connecting body 34 or 37, that is, in a vertical direction, as the semiconductor device is shown in FIG. 5. The bowl 35 and the intermediate plate 36 are provided with holes 38 and 39, respectively, and the connecting body 37 is provided with a central recess 40 and a radial slot 41 for the reception of a control electrode 42. The semiconductor wafer 30 is hermetically enclosed between the connecting bodies 34 and 37 by means of metal rings 43, 44 and 45 and a ceramic ring 46. The ring 43 is soldered to the connecting body 34 and to the ceramic ring 46, the ring 44 is soldered to the ceramic ring 46, and the ring 45 is soldered to the connecting body 37. These soldering operations are performed prior to the mounting of the semiconductor device.

After the mounting, hermetic sealing is performed by cold press welding the rings 44 and 45 together at 47. Cooling bodies are normally arranged on the connecting bodies but since these are of conventional kind they are not shown in FIG. 5. In use of the semiconductor device the cooling bodies are urged towards each other, pressing the connecting bodies 34, 37 against the respective intermediate plate, bowl and semiconductor wafer to provide the neceessary good electrical contact between the semiconductor wafer and the connecting bodies. It is also possible to make the connecting bodies 34 and 37 entirely of a composite material according to the present invention and in such a case the separate intermediate plates 33 and 36 are not required, the plates of composite material then being arranged between the semiconductor wafer 30 (or the bowls 32, 35) and the cooling bodies, which as mentioned previously may be of copper or aluminium.

A composite material according to the present invention may be used also for other purposes than that described, where there is a need of a material having a low coefficient of thermal expansion and a good thermal conductivity.

What is claimed is:

1. A composite material comprising a matrix of an alloy of iron and nickel having a coefficient of thermal expansion of at the most $3 \cdot 10^{-6} K^{-1}$ within the temperature range 20° C. to 100° C. and a plurality of spaced-apart veins of copper, all extending in substantially the same direction in the matrix, with the copper in each vein and the alloy of the matrix bonded to each other metallurgically through a boundary layer containing copper and the alloy and having a thickness of at least 0.01 to at most 5 $\mu$m, the metallurgical bond at each boundary layer being produced by joining the components of the composite material in a solid state.

2. A composite material according to claim 1, in which each boundary layer has a thickness of 0.01 to 1 $\mu$m.

3. A composite material comprising a matrix of an alloy of about 64 percent by weight iron and about 36 percent by weight nickel and a plurality of spaced-apart veins of copper all extending in substantially the same direction in the matrix, the copper constituting between 15 and 40 percent by volume of the composite material and with the copper and the alloy bonded to each other metallurgically through a boundary layer containing copper and the alloy having a thickness of at least 0.01 to at most 1 $\mu$m.

4. A composite material as claimed in claim 1 or claim 3, in which the thermal conductivity is in the range 75 to 150 $W \cdot m^{-1} \cdot K^{-1}$ in the direction of the copper veins.

* * * * *